United States Patent
Chen et al.

(10) Patent No.: US 12,222,241 B2
(45) Date of Patent: Feb. 11, 2025

(54) METHOD AND APPARATUS FOR EXTRACTING AVALANCHE SIGNAL

(71) Applicant: QUDOOR TECHNOLOGIES INC., Beijing (CN)

(72) Inventors: Liuping Chen, Beijing (CN); Yongsheng Fan, Beijing (CN); Liting Tong, Beijing (CN); Xiangsheng She, Beijing (CN); Nan Li, Beijing (CN); Qibing Wang, Beijing (CN); Xiangkui Wan, Beijing (CN)

(73) Assignee: QUDOOR TECHNOLOGIES INC., Beijing (CN)

( * ) Notice: Subject to any disclaimer, the term of this patent is extended or adjusted under 35 U.S.C. 154(b) by 0 days.

(21) Appl. No.: 18/684,686

(22) PCT Filed: Aug. 12, 2022

(86) PCT No.: PCT/CN2022/111963
§ 371 (c)(1),
(2) Date: Feb. 18, 2024

(87) PCT Pub. No.: WO2023/020370
PCT Pub. Date: Feb. 23, 2023

(65) Prior Publication Data
US 2024/0377251 A1    Nov. 14, 2024

(30) Foreign Application Priority Data

Aug. 18, 2021   (CN) .......................... 202110945841.X

(51) Int. Cl.
*G01J 1/44* (2006.01)
*H01L 31/107* (2006.01)

(52) U.S. Cl.
CPC .............. *G01J 1/44* (2013.01); *H01L 31/107* (2013.01); *G01J 2001/4466* (2013.01)

(58) Field of Classification Search
CPC .... G01J 1/44; G01J 2001/4466; H01L 31/107
See application file for complete search history.

(56) References Cited

U.S. PATENT DOCUMENTS

| | | | |
|---|---|---|---|
| 2010/0111305 A1 | 5/2010 | Yuan et al. | |
| 2010/0294919 A1 | 11/2010 | Kardynal et al. | |
| 2015/0076361 A1 | 3/2015 | Restelli et al. | |

FOREIGN PATENT DOCUMENTS

| | | |
|---|---|---|
| CN | 1560577 A | 1/2005 |
| CN | 102735351 A | 10/2012 |

(Continued)

OTHER PUBLICATIONS

Liu, Xiang, "Short Pulse Technology and Its Applications in Quantum Information Experiments", Theses of University of Science and Technology of China, Sep. 1, 2018, text, pp. 1-152.

(Continued)

*Primary Examiner* — Georgia Y Epps
*Assistant Examiner* — Don J Williams
(74) *Attorney, Agent, or Firm* — The Sun IP Law

(57) ABSTRACT

The disclosure provides a method and apparatus for extracting an avalanche signal. The method includes: obtaining an avalanche photodiode (APD) signal output by a single-photon detector, wherein the APD signal comprises an upper spike and a lower spike, the upper spike is generated along with a rising edge of a gating signal, and the lower spike is generated along with a falling edge of the gating signal; determining a delay position of the upper spike in the APD signal, so as to determine a delay position of the lower spike in the APD signal based on a pulse width of the gating signal; shifting a coincidence gate signal, so as to align a delay position of a falling edge of the coincidence gate signal with the delay position of the lower spike in the APD signal, wherein a pulse width of the coincidence gate signal is smaller than the pulse width of the gating signal; and (Continued)

extracting, as the avalanche signal, a second pulse that is generated through an AND operation on a first pulse that is generated by a partial signal, exceeding a discrimination threshold, in the APD signal and the coincidence gate signal.

16 Claims, 6 Drawing Sheets

(56) References Cited

FOREIGN PATENT DOCUMENTS

| | | | |
|---|---|---|---|
| CN | 107091687 A | 8/2017 | |
| CN | 211554222 U | 9/2020 | |
| CN | 112097899 A | 12/2020 | |
| CN | 112098787 A | 12/2020 | |
| CN | 112414567 A | 2/2021 | |
| CN | 213069073 U | 4/2021 | |
| CN | 113588103 A | 11/2021 | |
| EP | 1132724 A2 * | 12/2001 | ................ G01J 1/44 |

OTHER PUBLICATIONS

Jiang, Wenhao, "Research of High-performance Semiconductor Single-photon Detectors", Theses of University of Science and Technology of China, Oct. 1, 2018, text, pp. 1-85.
The first search report of CN application No. 202110945841.X issued on Apr. 21, 2022.

* cited by examiner

METHOD AND APPARATUS FOR EXTRACTING AVALANCHE SIGNAL

TECHNICAL FIELD

The disclosure relates to the technical field of quantum communication, in particular to a method and apparatus for extracting an avalanche signal from a quantum communication system.

BACKGROUND

At present, an avalanche photodiode (APD) is used by a single-photon detector in a quantum communication system (for example, a quantum key distribution system) for detecting optical pulses which carry encoded information in the general case.

However, in a gated APD, spike noise voltages are usually generated in APD signals along with rising and falling edges of a gating pulse due to the APD's own junction capacitance. In addition, these spike noise voltages are far more intensive than avalanche signals triggered by a single photon. As a result, the avalanche signals are likely to be drowned by these spike noise voltages and cannot be extracted, thus decreasing the final key rate of the quantum communication system.

SUMMARY

In order to solve the above technical problem, the disclosure provides a method and apparatus for extracting an avalanche signal.

According to one aspect of the disclosure, a method for extracting an avalanche signal is provided. The method includes: obtaining an avalanche photodiode (APD) signal output by a single-photon detector, wherein the APD signal comprises an upper spike and a lower spike, the upper spike is generated along with a rising edge of a gating signal, and the lower spike is generated along with a falling edge of the gating signal; determining a delay position of the upper spike in the APD signal, so as to determine a delay position of the lower spike in the APD signal based on a pulse width of the gating signal; shifting a coincidence gate signal, so as to align a delay position of a falling edge of the coincidence gate signal with the delay position of the lower spike in the APD signal, wherein a pulse width of the coincidence gate signal is smaller than the pulse width of the gating signal; and extracting, as the avalanche signal, a second pulse that is generated through an AND operation on a first pulse that is generated by a partial signal, exceeding a discrimination threshold, in the APD signal and the coincidence gate signal.

According to another aspect of the disclosure, an apparatus for extracting an avalanche signal is provided. The apparatus includes: an avalanche photodiode (APD) signal obtaining unit, configured to obtain an APD signal output by a single-photon detector, wherein the APD signal comprises an upper spike and a lower spike, the upper spike is generated along with a rising edge of a gating signal, and the lower spike is generated along with a falling edge of the gating signal; a spike position determining unit, configured to determine a delay position of the upper spike in the APD signal, so as to determine a delay position of the lower spike in the APD signal based on a pulse width of the gating signal; a coincidence gate adjustment unit, configured to shift a coincidence gate signal, so as to align a delay position of a falling edge of the coincidence gate signal with the delay position of the lower spike in the APD signal, wherein a pulse width of the coincidence gate signal is smaller than the pulse width of the gating signal; and a coincidence discrimination unit, configured to extract, as the avalanche signal, a second pulse that is generated through an AND operation on a first pulse that is generated by a partial signal, exceeding a discrimination threshold, in the APD signal and the coincidence gate signal.

According to another aspect of the disclosure, a computer-readable storage medium is provided. The computer-readable storage medium stores a computer program, where the computer program implements the method for extracting an avalanche signal when executed by a processor.

According to another aspect of the disclosure, a computation apparatus is provided. The computation apparatus includes a processor; and a memory, where the memory stores a computer program, and the computer program implements the method for extracting an avalanche signal according to when executed by the processor.

According to the method and apparatus for extracting an avalanche signal provided by the disclosure, the avalanche signal can be extracted from the APD signal without adding a new investment (such as other optical devices or electrical devices), influence of spike noise caused by the gating signal on avalanche signal extraction can be further effectively avoided, and the final key rate of a quantum communication system can be greatly improved.

BRIEF DESCRIPTION OF THE DRAWINGS

The above objectives and features of the disclosure will become clearer from the following description in conjunction with accompanying drawings.

DETAILED DESCRIPTION OF THE EMBODIMENTS

Examples of the disclosure will be described in detail below with reference to accompanying drawings.

Figure 1:
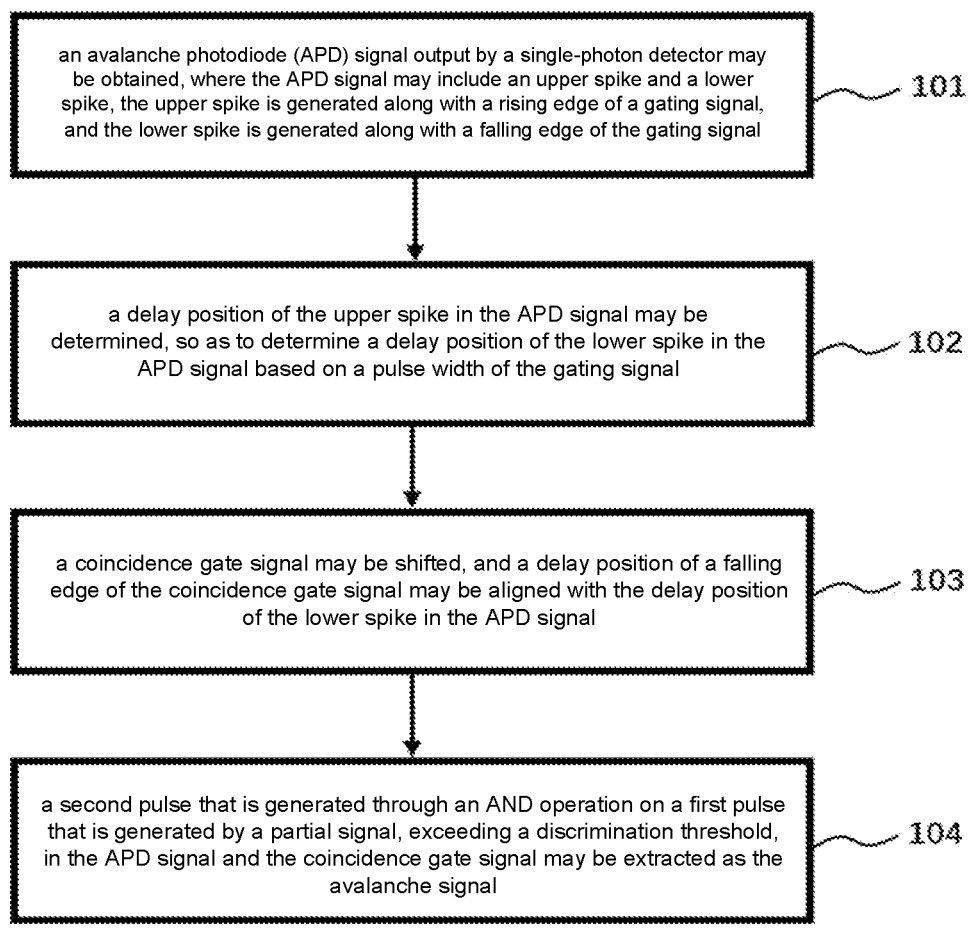
FIG. 1 shows a flowchart of a method for extracting an avalanche signal according to an illustrative example of the disclosure.

FIG. 1 shows a flowchart of a method for extracting an avalanche signal according to an illustrative example of the disclosure. The method shown in FIG. 1 may be run as an algorithm in including but not limited to, a computation apparatus of a quantum communication system.

With reference to FIG. 1, the method shown in FIG. 1 may include the following steps.

In step 101, an avalanche photodiode (APD) signal output by a single-photon detector may be obtained, where the APD signal may include an upper spike and a lower spike, the upper spike is generated along with a rising edge of a gating signal, and the lower spike is generated along with a falling edge of the gating signal.

Figure 2:
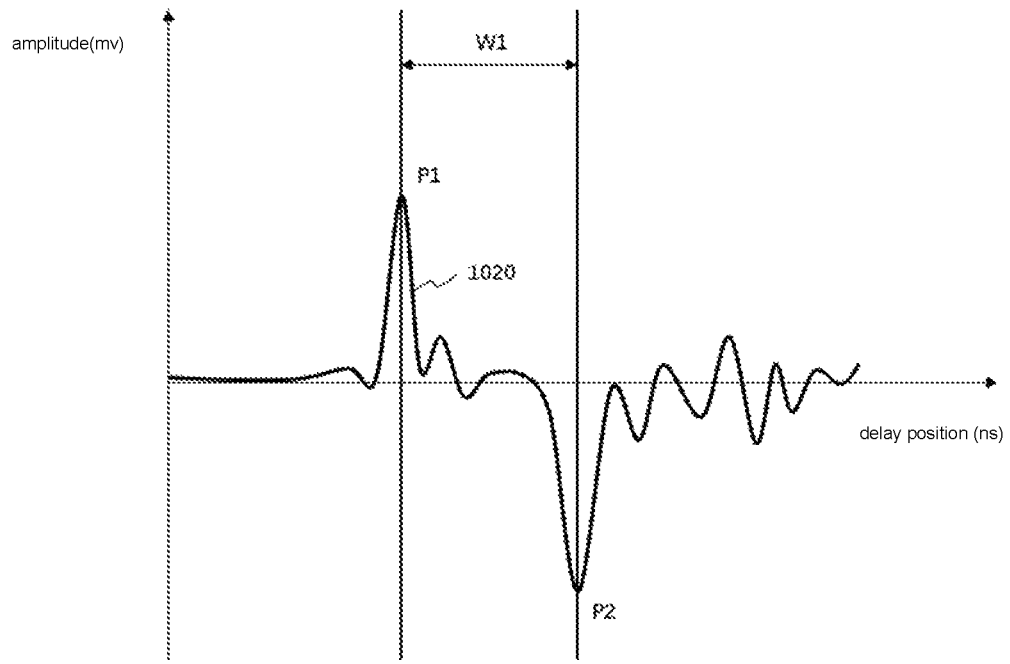
FIG. 2 shows a schematic diagram of an avalanche photodiode (APD) signal including an upper spike and a lower spike according to an illustrative example of the disclosure.

FIG. 2 shows a schematic diagram of an APD signal 1020 including an upper spike P1 and a lower spike P2 according to an illustrative example of the disclosure.

In addition, even under the condition that no bias voltage is loaded, the APD signal 1020 may generate the upper spike P1 along with the rising edge of the gating signal 1010 and the lower spike P2 with the falling edge of the gating signal 1010, and a distance between delay positions of the upper spike P1 and the lower spike P2 is equal to a pulse width W1 of one gating signal 1010.

In step 102, a delay position of the upper spike in the APD signal may be determined, so as to determine a delay position of the lower spike in the APD signal based on a pulse width of the gating signal.

In an example, the pulse width of the coincidence gate signal may be adjusted to a maximum, the discrimination threshold may be gradually decreased from an upper portion of the APD signal to a lower portion of the APD signal according to a predetermined step, and for each decreased discrimination threshold, second pulses that are generated through an AND operation on a pulse that is generated by a partial signal, exceeding the discrimination threshold, in the APD signal and the coincidence gate signal may be counted until the counting for second pulses goes from non-zero to zero. The pulse width of the coincidence gate signal may be adjusted to a minimum, the coincidence gate signal may be gradually shifted from a left side of the APD signal to a right side of the APD signal according to a predetermined step, for each shifted coincidence gate signal, a pulse count that is generated through an AND operation on a pulse that is generated by a partial signal, exceeding the discrimination threshold, in the APD signal and the coincidence gate signal may be counted, and a first delay position of the coincidence gate signal may be recorded in a case that the counting for second pulses first goes from non-zero to zero and a second delay position of the coincidence gate signal in a case that the counting for second pulses first goes from zero to non-zero. A midpoint between the first delay position and the second delay position may be determined as the delay position of the upper spike in the APD signal.

Next, a process of determining the delay position of the upper spike will be described in detail with reference to FIGS. 3 and 4.

Figure 3:
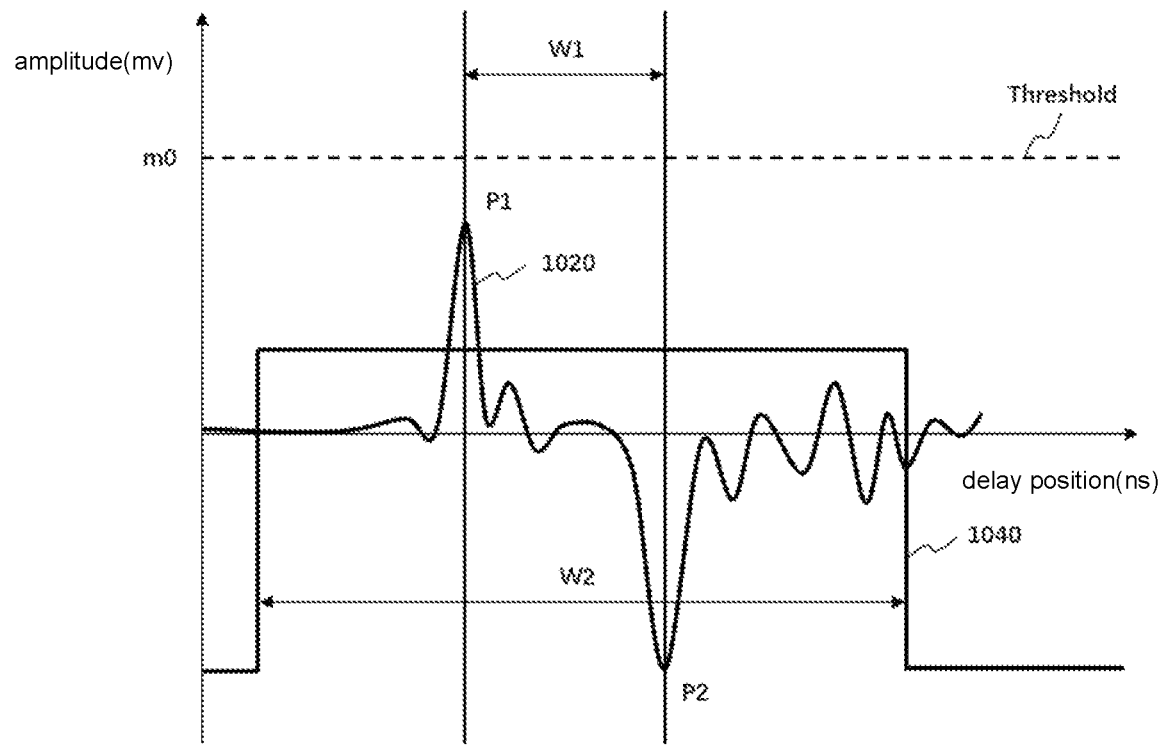
FIG. 3 shows a schematic diagram of determining a delay position of an upper spike in an APD signal according to an illustrative example of the disclosure.

FIG. 3 shows a schematic diagram of determining a delay position of an upper spike P1 in an APD signal 1020 according to an illustrative example of the disclosure. FIG. 4 shows another schematic diagram of determining a delay position of an upper spike P1 in an APD signal 1020 according to an illustrative example of the disclosure.

With reference to FIG. 3, the pulse width W2 of the coincidence gate signal 1040 may be adjusted to the maximum, such that the pulse width W2 of the coincidence gate signal 1040 can be greater than the pulse width W1 of the gating signal 1010 and include the pulse width W1 of the gating signal 1010. The discrimination threshold may be set as an amplitude m0 (including but not limited to, 2200 mv), and then the discrimination threshold may be gradually decreased from an upper portion of the APD signal 1020 to a lower portion of the APD signal 1020 according to a predetermined step (including but not limited to, 5 mv). In a case that the discrimination threshold is decreased from the amplitude m0 to an amplitude m1, a partial signal in the APD signal 1020 first exceeds the discrimination threshold, and an extremely narrow pulse 1030 (as shown in FIG. 4) is generated as a result. A pulse 1050 count is generated through an AND operation on the pulse 1030 and the coincidence gate signal 1040. With reduction of the discrimination threshold, the pulse 1050 count may be changed from "0" to "1", and such a change in the pulse 1050 count indicates that the discrimination threshold is close to or is located at a top of an upper spike P1 in the APD signal 1020.

Figure 4:
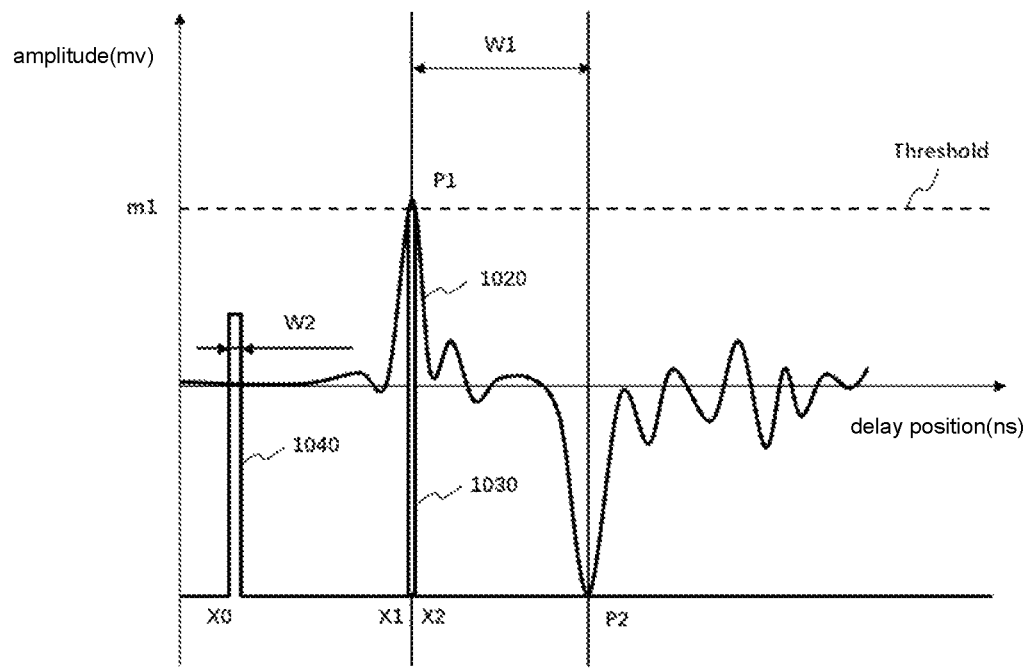
FIG. 4 shows another schematic diagram of determining a delay position of an upper spike in an APD signal according to an illustrative example of the disclosure.

With reference to FIG. 4, in a case that the discrimination threshold is close to the top of the upper spike P1 in the APD signal 1020, the coincidence gate signal 1040 may be set at a minimum delay position X0, and the pulse width W2 of the coincidence gate signal 1040 may be adjusted to a minimum. Under the condition that the discrimination threshold keeps the amplitude m1, the coincidence gate signal 1040 may be gradually shifted from a left side of the APD signal 1020 to a right side of the APD signal 1020 according to a predetermined step (including but not limited to, 11 ps). In a case that the coincidence gate signal 1040 shifts from a delay position X0 to a vicinity of a delay position X1, a partial signal in the APD signal 1020 first exceeds the discrimination threshold, and an extremely narrow pulse 1030 is generated as a result. A pulse 1050 count is generated through an AND operation on the pulse 1030 and the coincidence gate signal 1040. With shift of the coincidence gate signal 1040, the pulse 1050 count may be changed from "0" to "1" in the vicinity of the delay position X1, and such a change in the pulse 1050 count indicates that the coincidence gate signal 1040 is close to or is located at a left boundary of the upper spike P1. At the same time, the delay position X1 of the coincidence gate signal 1040 may be recorded. In a case that the coincidence gate signal 1040 shifts from the delay position X1 to a vicinity of a delay position X2, a partial signal in the APD signal 1020 continuously exceeds the discrimination threshold, and an extremely narrow pulse 1030 is continuously generated as a result. A pulse 1050 count is generated through an AND operation on the pulse 1030 and the coincidence gate signal 1040. With shift of the coincidence gate signal 1040, the pulse 1050 count may be changed from "1" to "0" in the vicinity of the delay position X2, and such a change in the pulse 1050 count indicates that the coincidence gate signal 1040 is close to or is located at a right boundary of the upper spike P1. At the same time, the delay position X2 of the coincidence gate signal 1040 may be recorded. Next, a midpoint between the delay position X1 and the delay position X2 may be computed based on a set of delay positions X1 and X2 recorded at the amplitude m1, so as to estimate a delay position of the upper spike P1 in the APD signal 1020. In addition, in order to obtain a more accurate delay position of the upper spike P1, the discrimination threshold may be repeatedly adjusted (increased or decreased) with a very small margin based on the amplitude m1, so as to obtain the delay position X1 and the delay position X2 in a plurality of amplitude records. Then the midpoint between a plurality of delay positions X1 and the delay positions X2 can be computed, and an average of these midpoints may be determined as the delay position of the upper spike P1 in the APD signal 1020.

Further, after the delay position of the upper spike P1 in the APD signal 1020 is determined, a delay position that is spaced from the delay position of the upper spike P1 in the APD signal 1020 by a pulse width W1 of one gating signal 1010 may be determined as a delay position of a lower spike P2 in the APD signal 1020.

It should be understood that although FIGS. 3 and 4 show the schematic diagrams of determining the delay position of the upper spike in the APD signal according to an illustrative example of the disclosure, the instances shown in the schematic diagrams are merely schematic, and the disclosure is not limited to the instances.

Returning to FIG. 1 again, in step 103, a coincidence gate signal may be shifted, and a delay position of a falling edge of the coincidence gate signal may be aligned with the delay position of the lower spike in the APD signal.

Figure 5:
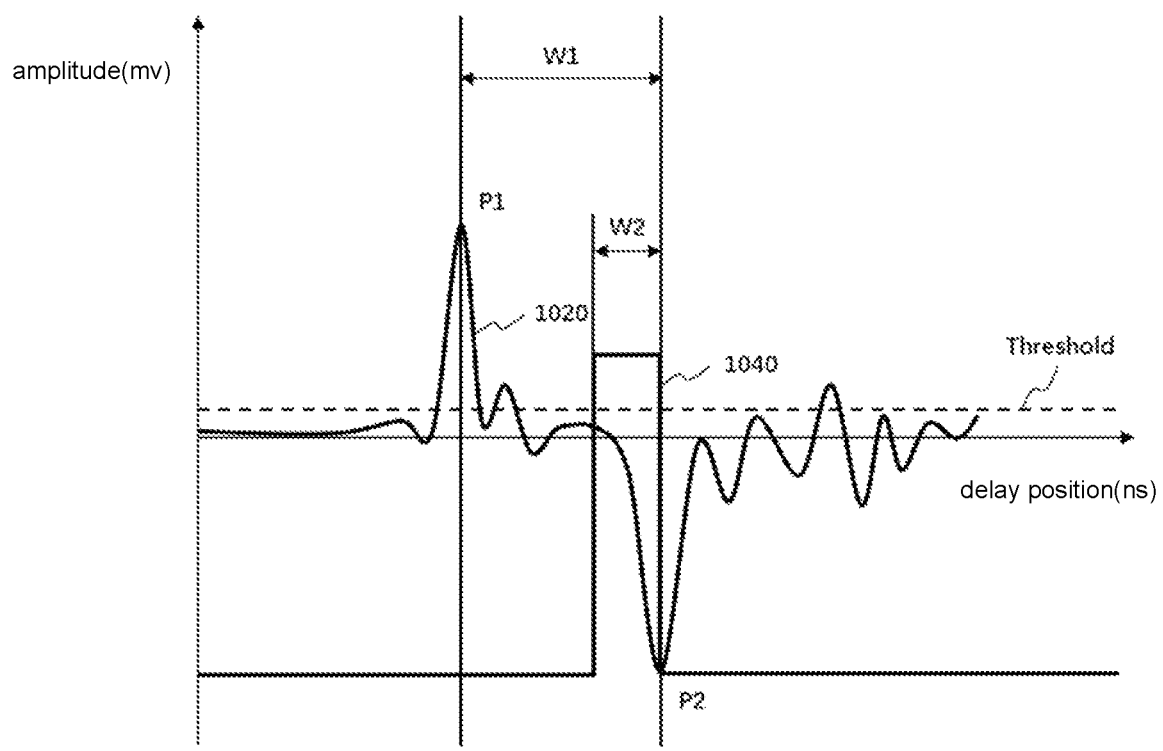
FIG. 5 shows a schematic diagram of aligning a delay position of a falling edge of a coincidence gate signal with a delay position of a lower spike in an APD signal according to an illustrative example of the disclosure.

FIG. 5 shows a schematic diagram of aligning a delay position of a falling edge of a coincidence gate signal 1040 with a delay position of a lower spike P2 in an APD signal 1020 according to an illustrative example of the disclosure.

In step 104, a second pulse that is generated through an AND operation on a first pulse that is generated by a partial signal, exceeding a discrimination threshold, in the APD signal and the coincidence gate signal may be extracted as the avalanche signal.

In an instance, a discrimination threshold may be determined based on a spike in an avalanche section adjacent to the lower spike in the APD signal under the condition that no avalanche occurs.

In this instance, the pulse width of the coincidence gate signal may be adjusted to be equal to a duration of the avalanche section, the discrimination threshold may be gradually decreased from an upper portion of the APD signal to a lower portion of the APD signal according to a predetermined step, and for each decreased discrimination threshold, second pulses that are generated through an AND operation on a pulse that is generated by a partial signal, exceeding the discrimination threshold, in APD signal that is located in the avalanche section and the coincidence gate signal may be counted until the counting for second pulses goes from non-zero to zero.

Figure 6:
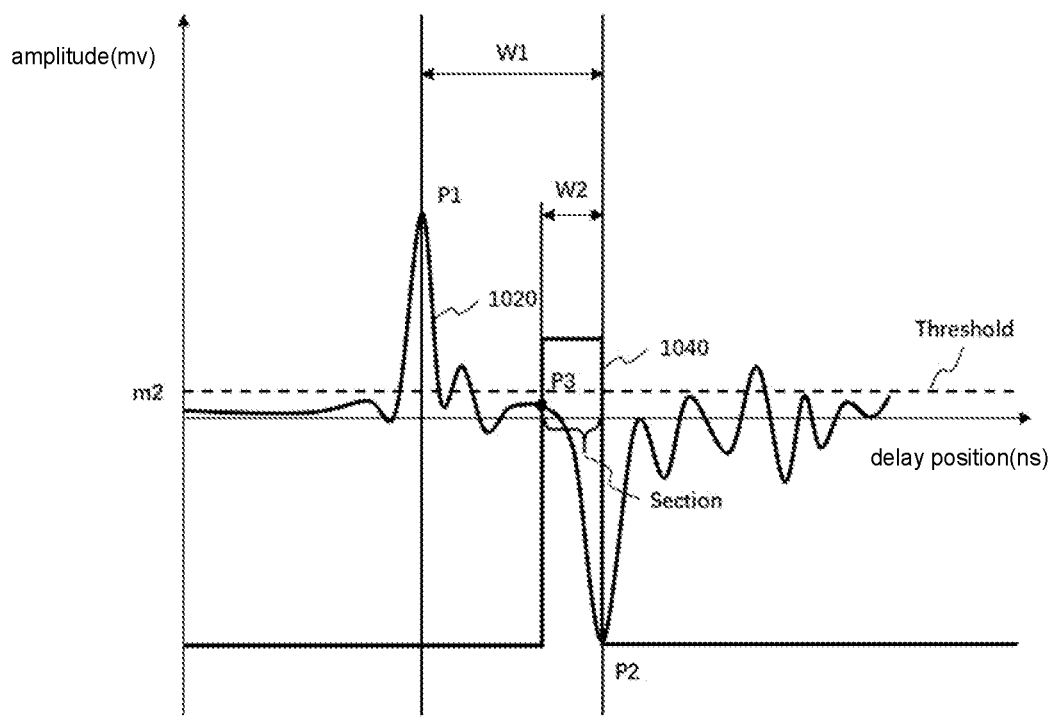
FIG. 6 shows a schematic diagram of determining a discrimination threshold based on a spike in an avalanche section adjacent to a lower spike in an APD signal under the condition that no avalanche occurs according to an illustrative example of the disclosure.

FIG. 6 shows a schematic diagram of determining a discrimination threshold based on a spike P3 in an avalanche section adjacent to a lower spike in an APD signal under the condition that no avalanche occurs according to an illustrative example of the disclosure.

With reference to FIG. 6, under the condition that the delay position of the falling edge of the coincidence gate signal 1040 is aligned with the delay position of the lower spike P2 in the APD signal 1020, the pulse width W2 of the coincidence gate signal 1040 may be adjusted to be equal to the duration of the avalanche section, and the coincidence gate signal 1040 can coincide with the avalanche section as a result. The discrimination threshold may be set as the amplitude m0 (including but not limited to 50 mv), and then the discrimination threshold may be gradually decreased from an upper portion of the APD signal 1020 to a lower portion of the APD signal 1020 according to a predetermined step (including but not limited to 5 mv). In a case that the discrimination threshold is decreased from the amplitude m0 to an amplitude m2, a partial signal in the APD signal 1020 that is located in the avalanche section first exceeds the discrimination threshold, and an extremely narrow pulse 1030 is generated as a result. A pulse 1050 count is generated through an AND operation on the pulse 1030 and the coincidence gate signal 1040. With reduction of the discrimination threshold, the pulse 1050 count may be changed from "0" to "1", and such a change in the pulse 1050 count indicates that the discrimination threshold is close to or is located at a spike P3 in the avalanche section.

It should be understood that although FIG. 6 shows the schematic diagram of determining the discrimination threshold based on the spike P3 in the avalanche section adjacent to a lower spike in an APD signal under the condition that no avalanche occurs according to an illustrative example of the disclosure, the instances shown in the schematic diagrams are merely schematic, and the disclosure is not limited to the instances.

In addition, in an instance, both the gating signal and the coincidence gate signal may be synchronized with an encoding clock of a quantum communication system. Based on that, the gating signal and the coincidence gate signal can be synchronized with an optical pulse transmitted in the quantum communication system, so as to provide a reliable discrimination range for extraction of the avalanche signal.

Figure 7:
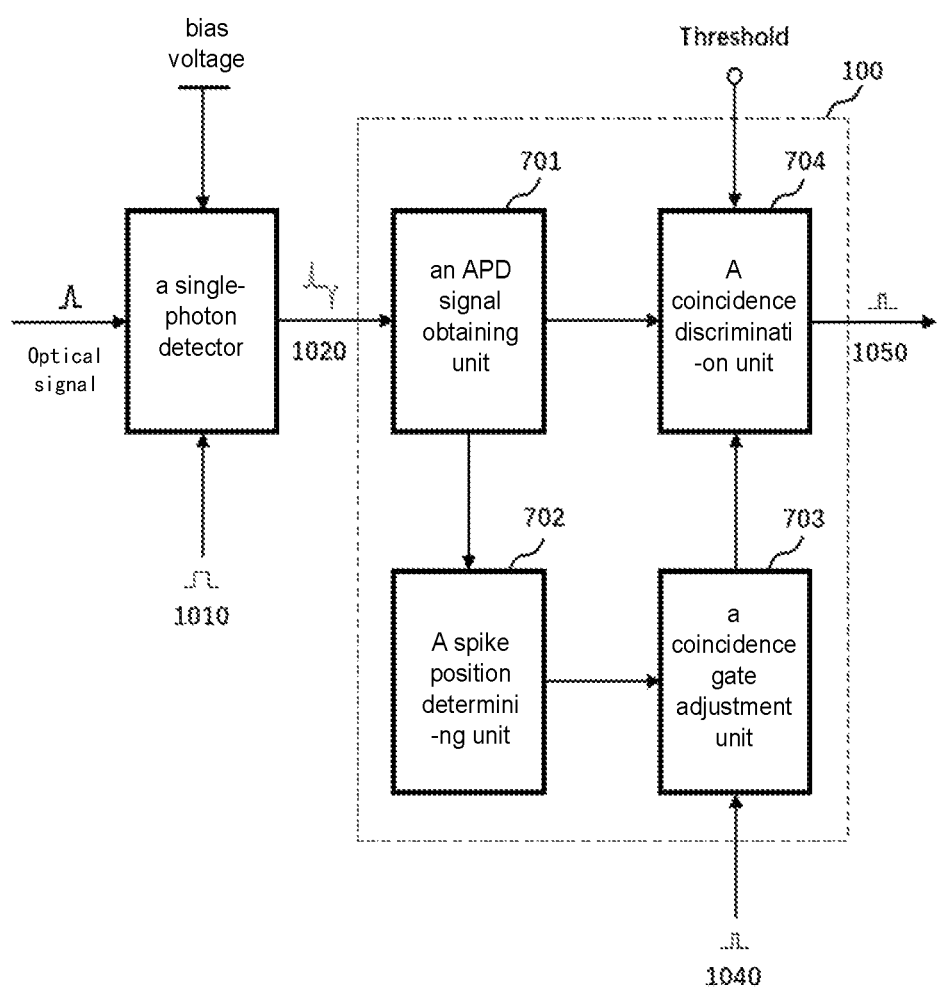
FIG. 7 shows a structural diagram of an apparatus for extracting an avalanche signal according to an illustrative example of the disclosure.
Figure 8:
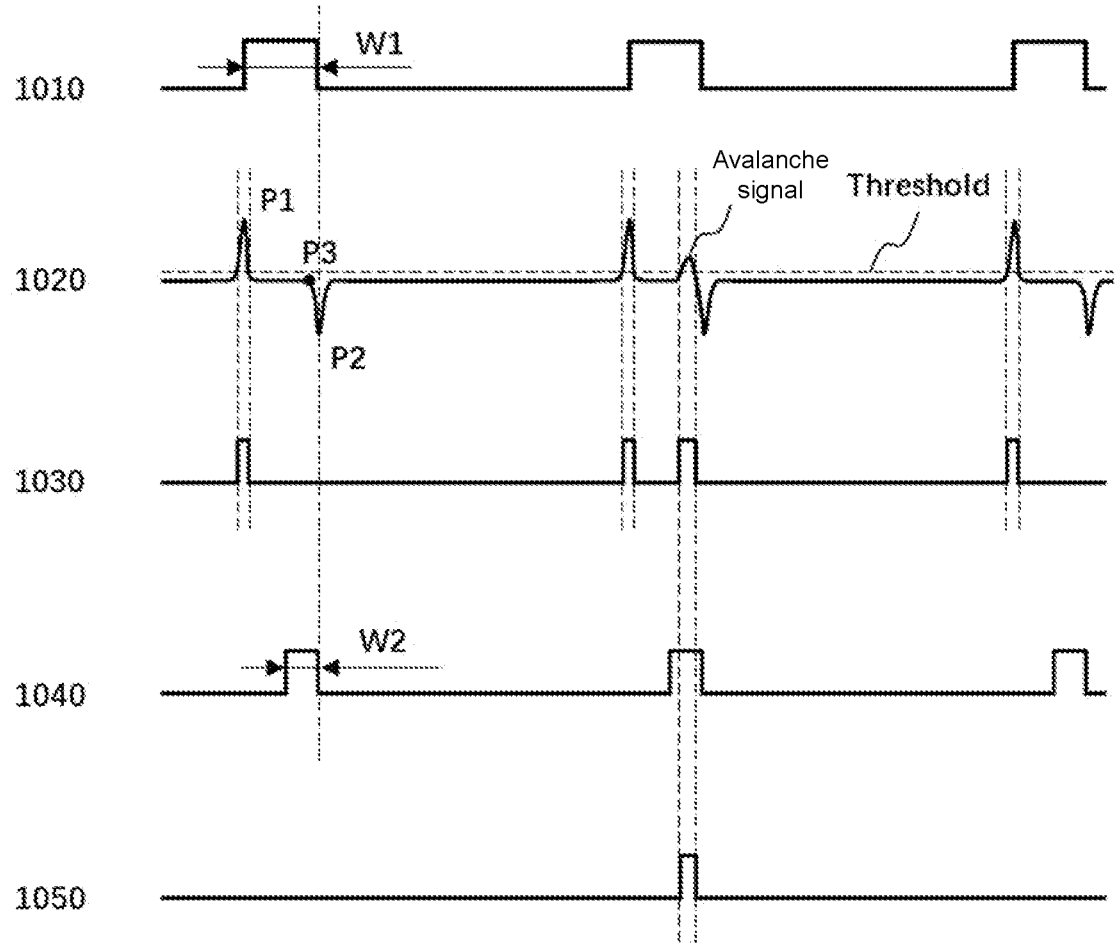
FIG. 8 shows a schematic diagram of a signal time series of an apparatus for extracting an avalanche signal according to an illustrative example of the disclosure.

FIG. 7 shows a structural diagram of an apparatus for extracting an avalanche signal according to an illustrative example of the disclosure. FIG. 8 shows a schematic diagram of a signal time series of an apparatus for extracting an avalanche signal according to an illustrative example of the disclosure. The apparatus shown in FIG. 7 may be integrated in including but not limited to a computation apparatus of a quantum communication system.

With reference to FIG. 7, the apparatus 100 for extracting an avalanche signal according to an illustrative example of the disclosure may at least include an APD signal obtaining unit 701, a spike position determining unit 702, a coincidence gate adjustment unit 703 and a coincidence discrimination unit 704.

In the apparatus shown in FIG. 7, the APD signal obtaining unit 701 may be configured to obtain an APD signal 1020 output by a single-photon detector, where the APD signal may include an upper spike P1 generated along with a rising edge of a gating signal 1010 and a lower spike P2 generated along with a falling edge of the gating signal 1010. The spike position determining unit 702 may be configured to determine a delay position of the upper spike P1 in the APD signal 1020, and determine a delay position of the lower spike P2 in the APD signal 1020 based on a pulse width W1 of the gating signal 1010. The coincidence gate adjustment unit 703 may be configured to shift a coincidence gate signal 1040, and align a delay position of a falling edge of the coincidence gate signal 1040 with the delay position of the lower spike P2 in the APD signal 1020. The coincidence discrimination unit 704 may be configured to count an AND operation on a comparison result between the APD signal 1020 and the discrimination threshold and the coincidence gate signal 1040, and extract the avalanche signal from the APD signal 1020.

In the apparatus 100 for extracting an avalanche signal shown in FIG. 7, the spike position determining unit 702 may include a threshold scanning unit, a coincidence gate scanning unit and a delay position determining unit (not shown). In this example, the threshold scanning unit may be configured to adjust the pulse width of the coincidence gate signal 1040 to a maximum, gradually decrease the discrimination threshold from an upper portion of the APD signal 1020 to a lower portion of the APD signal 1020 according to a predetermined step, and count, for each reduced discrimination threshold, second pulses 1050 that are generated through an AND operation on a pulse 1030 that is generated by a partial signal, exceeding the discrimination threshold, of the APD signal 1020 and the coincidence gate signal 1040 until the counting for second pulses 1050 goes from non-zero to zero. The coincidence gate scanning unit may be configured to adjust the pulse width of the coincidence gate signal 1040 to a minimum, gradually shift the coincidence gate signal 1040 from a left side of the APD signal 1020 to a right side of the APD signal 1020 according to a predetermined step, count, for each shifted coincidence gate signal, a pulse 1050 count that is generated through an AND operation on a pulse 1030 that is generated by a partial signal, exceeding the discrimination threshold, of the APD signal 1020 and the coincidence gate signal 1040, and record a first delay position of the coincidence gate signal 1040 in a case that the counting for second pulses 1050 first goes from non-zero to zero and a second delay position of the coincidence gate signal 1040 in a case that the counting for second pulses 1050 first goes from zero to non-zero. The delay position determining unit may be configured to determine a midpoint between the first delay position and the second delay position as the delay position of the upper spike P1 in the APD signal 1020.

In the apparatus 100 for extracting an avalanche signal shown in FIG. 7, a discrimination threshold may be determined based on a spike P3 in an avalanche section adjacent to the lower spike P2 in the APD signal 1020 under the condition that no avalanche occurs. In this instance, the threshold scanning unit may be further configured to adjust the pulse width W2 of the coincidence gate signal 1040 to be equal to a duration of the avalanche section, gradually decrease the discrimination threshold from an upper portion of the APD signal 1020 to a lower portion of the APD signal 1020 according to a predetermined step, and count, for each decreased discrimination threshold, second pulses 1050 that are generated through an AND operation on a pulse 1030 that is generated by a partial signal, exceeding the discrimination threshold, of the APD signal 1020 and the coincidence gate signal 1040 until the counting for second pulses 1050 goes from non-zero to zero.

It can be seen that according to the method and apparatus for extracting an avalanche signal provided by the illustrative examples of the disclosure, the avalanche signal can be extracted from the APD signal without adding a new investment (such as other optical devices or electrical devices), influence of spike noise caused by the gating signal on avalanche signal extraction can be further effectively avoided, and the final key rate of a quantum communication system can be greatly improved.

According to the illustrative example of the disclosure, a computer-readable storage medium storing a computer program may also be provided. The computer-readable storage medium stores the computer program that causes a processor to execute the method for extracting an avalanche signal according to the disclosure when executed by the processor. The computer-readable storage medium is any data storage apparatus that may store computer system-readable data. Instances of the computer-readable recording medium include a read-only memory, a random access memory, a compact disc read-only memory, a magnetic tape, a floppy disk, an optical data storage apparatus and a carrier wave (such as data transmission through the Internet via a wired or wireless transmission path).

According to the illustrative example of the disclosure, a computation apparatus may also be provided. The computation apparatus may include a processor and a memory. The memory is configured to store a computer program. The computer program causes the processor to execute the method for extracting an avalanche signal according to the disclosure when executed by the processor.

Although the disclosure have been shown and described with reference to preferred examples, it should be understood by those skilled in the art that various changes and modifications can be made to these examples without departing from the spirit and scope of the disclosure defined by the claims.

What is claimed is:

1. A method for extracting an avalanche signal, comprising:
    obtaining an avalanche photodiode (APD) signal output by a single-photon detector, wherein the APD signal comprises an upper spike and a lower spike, the upper spike is generated along with a rising edge of a gating signal, and the lower spike is generated along with a falling edge of the gating signal;
    determining a delay position of the upper spike in the APD signal, so as to determine a delay position of the lower spike in the APD signal based on a pulse width of the gating signal;
    shifting a coincidence gate signal, so as to align a delay position of a falling edge of the coincidence gate signal with the delay position of the lower spike in the APD signal, wherein a pulse width of the coincidence gate signal is smaller than the pulse width of the gating signal; and
    extracting, as the avalanche signal, a second pulse that is generated through an AND operation on a first pulse that is generated by a partial signal, exceeding a discrimination threshold, in the APD signal and the coincidence gate signal.

2. The method according to claim 1, wherein the determining the delay position of the upper spike in the APD signal comprises:
    adjusting the pulse width of the coincidence gate signal to a maximum, gradually decreasing the discrimination threshold from an upper portion of the APD signal to a lower portion of the APD signal according to a predetermined step, and counting, for each decreased discrimination threshold, the second pulses that are generated through an AND operation on the first pulses and the coincidence gate signal until the counting for the second pulses goes from non-zero to zero;
    adjusting the pulse width of the coincidence gate signal to a minimum, gradually shifting the coincidence gate signal from a left side of the APD signal to a right side of the APD signal according to a predetermined step, counting, for each shifted coincidence gate signal, the second pulses that are generated through an AND operation on the first pulses and the coincidence gate signal, and recording a first delay position of the coincidence gate signal in a case that the counting for the second pulses first goes from non-zero to zero and a second delay position of the coincidence gate signal in a case that the counting for the second pulses first goes from zero to non-zero; and
    determining a midpoint between the first delay position and the second delay position as the delay position of the upper spike in the APD signal.

3. A non-transitory computer-readable storage medium, storing a computer program, wherein the computer program implements the method for extracting an avalanche signal according to claim 2 when executed by a processor.

4. A computation apparatus, comprising:
    a processor, and a memory, wherein the memory stores a computer program, and the computer program implements the method for extracting an avalanche signal according to claim 2 when executed by the processor.

5. The method according to claim 1, further comprising:
Determining the discrimination threshold based on a spike in an avalanche section adjacent to the lower spike in the APD signal under the condition that no avalanche occurs.

6. The method according to claim 5, wherein the determining the discrimination threshold based on the spike in an avalanche section adjacent to the lower spike in the APD signal under the condition that no avalanche occurs comprises:
adjusting the pulse width of the coincidence gate signal to be equal to a duration of the avalanche section under the condition that no avalanche occurs, gradually decreasing the discrimination threshold from an upper portion of the APD signal to a lower portion of the APD signal according to a predetermined step, and counting, for each decreased discrimination threshold, the second pulses that are generated through an AND operation on the first pulses that are generated by a partial signal, exceeding the discrimination threshold, of the APD signal that is located in the avalanche section and the coincidence gate signal until the counting for the second pulses goes from non-zero to zero.

7. A non-transitory computer-readable storage medium, storing a computer program, wherein the computer program implements the method for extracting an avalanche signal according to claim 6 when executed by a processor.

8. A computation apparatus, comprising:
a processor, and
a memory, wherein the memory stores a computer program, and the computer program implements the method for extracting an avalanche signal according to claim 6 when executed by the processor.

9. A non-transitory computer-readable storage medium, storing a computer program, wherein the computer program implements the method for extracting an avalanche signal according to claim 5 when executed by a processor.

10. A computation apparatus, comprising:
a processor, and
a memory, wherein the memory stores a computer program, and the computer program implements the method for extracting an avalanche signal according to claim 5 when executed by the processor.

11. A non-transitory computer-readable storage medium, storing a computer program, wherein the computer program implements the method for extracting an avalanche signal according to claim 1 when executed by a processor.

12. A computation apparatus, comprising:
a processor, and
a memory, wherein the memory stores a computer program, and the computer program implements the method for extracting an avalanche signal according to claim 1 when executed by the processor.

13. An apparatus for extracting an avalanche signal, comprising:
an avalanche photodiode (APD) signal obtaining unit, configured to obtain an APD signal output by a single-photon detector, wherein the APD signal comprises an upper spike and a lower spike, the upper spike is generated along with a rising edge of a gating signal, and the lower spike is generated along with a falling edge of the gating signal;
a spike position determining unit, configured to determine a delay position of the upper spike in the APD signal, so as to determine a delay position of the lower spike in the APD signal based on a pulse width of the gating signal;
a coincidence gate adjustment unit, configured to shift a coincidence gate signal, so as to align a delay position of a falling edge of the coincidence gate signal with the delay position of the lower spike in the APD signal, wherein a pulse width of the coincidence gate signal is smaller than the pulse width of the gating signal; and
a coincidence discrimination unit, configured to extract, as the avalanche signal, a second pulse that is generated through an AND operation on a first pulse that is generated by a partial signal, exceeding a discrimination threshold, in the APD signal and the coincidence gate signal.

14. The apparatus according to claim 13, wherein the spike position determining unit comprises:
a threshold scanning unit, configured to adjust the pulse width of the coincidence gate signal to a maximum, gradually decrease the discrimination threshold from an upper portion of the APD signal to a lower portion of the APD signal according to a predetermined step, and count, for each decreased discrimination threshold, the second pulses that are generated through an AND operation on the first pulses until the counting for the second pulses goes from non-zero to zero;
a coincidence gate scanning unit, configured to adjust the pulse width of the coincidence gate signal to a minimum, gradually shift the coincidence gate signal from a left side of the APD signal to a right side of the APD signal according to a predetermined step, count, for each shifted coincidence gate signal, the second pulses that are generated through an AND operation on the first pulses and the coincidence gate signal, and record a first delay position of the coincidence gate signal in a case that the counting for the second pulses first goes from non-zero to zero and a second delay position of the coincidence gate signal in a case that the counting for the second pulses first goes from zero to non-zero; and
a delay position determining unit, configured to determine a midpoint between the first delay position and the second delay position as the delay position of the upper spike in the APD signal.

15. The apparatus according to claim 13, further comprising:
a discrimination threshold determining unit, configured to determine the discrimination threshold based on a spike in an avalanche section adjacent to the lower spike in the APD signal under the condition that no avalanche occurs.

16. The apparatus according to claim 15, wherein the discrimination threshold determining unit is further configured to adjust the pulse width of the coincidence gate signal to be equal to a duration of the avalanche section under the condition that no avalanche occurs, gradually decrease the discrimination threshold from an upper portion of the APD signal to a lower portion of the APD signal according to a predetermined step, and count, for each decreased discrimination threshold, the second pulse that are generated through an AND operation on the first pulses that are generated by a partial signal, exceeding the discrimination threshold, in the APD signal that is located in the avalanche section and the coincidence gate signal until the counting for the second pulses goes from non-zero to zero.

\* \* \* \* \*